United States Patent
Graninger

(10) Patent No.: US 10,782,258 B2
(45) Date of Patent: Sep. 22, 2020

(54) SUPERCONDUCTOR CRITICAL TEMPERATURE MEASUREMENT

(71) Applicant: Aurelius L. Graninger, Sykesville, MD (US)

(72) Inventor: Aurelius L. Graninger, Sykesville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 261 days.

(21) Appl. No.: 16/120,859

(22) Filed: Sep. 4, 2018

(65) Prior Publication Data

US 2020/0072772 A1    Mar. 5, 2020

(51) Int. Cl.
  *G01N 25/12*    (2006.01)
  *H01L 27/18*    (2006.01)
  *H01L 39/04*    (2006.01)

(52) U.S. Cl.
  CPC ............. *G01N 25/12* (2013.01); *H01L 27/18* (2013.01); *H01L 39/04* (2013.01)

(58) Field of Classification Search
  CPC ...... H05K 7/20372; G01K 7/16; G01K 7/006; G01N 25/12; H01F 6/04; H01F 41/048;
  (Continued)

(56) References Cited

U.S. PATENT DOCUMENTS

| | | |
|---|---|---|
| 2,036,432 A | 12/1933 | Musante et al. |
| 4,846,095 A | 7/1989 | Emslander |

(Continued)

FOREIGN PATENT DOCUMENTS

| | | |
|---|---|---|
| DE | 10138711 A1 | 4/2002 |
| EP | 2400828 A1 | 12/2011 |

(Continued)

OTHER PUBLICATIONS

Iversen A Ed—Institute of Electrical and Electronics Engineers: "Next Generation Power Electronics for Space and Aircraft. / Part II—Packaging", Aerospace Power Systems. Boston, Aug. 4-9, 1991; [Proceedings of the Intersociety Energy Conversion Engineering Conference], New York, IEEE, US, vol. 1, Aug. 4, 1991 (Aug. 4, 1991), pp. 177-182, XP 000280446, ISBN: 978-0-89448-163-5, p. 179, col. 2, p. 181, cols. 1-2, figures 6-8.

(Continued)

*Primary Examiner* — Gail Kaplan Verbitsky
(74) *Attorney, Agent, or Firm* — Tarolli, Sundheim, Covell & Tummino LLP

(57) ABSTRACT

A system for measuring critical temperatures of superconducting components of a superconducting circuit housed in a cryogenic chamber with a controllable ambient temperature is described. The superconducting circuit can have a plurality of superconductor-resistor pairs connected in series. Each of the plurality of superconductor-resistor pairs can include a superconducting component and a resistor coupled in parallel with the superconducting component. The system can also include a resistance meter that measures a resistance of the superconducting circuit. The system further includes a controller that commands the cryogenic chamber to gradually sweep the ambient temperature. The controller can also record an instant ambient temperature as a critical temperature for a given superconducting component of a corresponding one of the plurality of superconductor-resistor pairs in response to detecting a change in a measured resistance across an input node and an output node of the superconducting circuit.

20 Claims, 4 Drawing Sheets

(58) Field of Classification Search
CPC ... H01F 6/008; H01F 6/02; H01F 6/06; H01L 27/18; H01L 39/04
USPC .............. 374/10–12, 185, 178, 163, 21, 4, 5
See application file for complete search history.

(56) References Cited

U.S. PATENT DOCUMENTS

| | | | |
|---|---|---|---|
| 4,962,444 A | 10/1990 | Niggemann | |
| 5,268,815 A | 12/1993 | Cipolla et al. | |
| 5,552,371 A * | 9/1996 | Chen | G01F 23/247 505/160 |
| 5,999,407 A | 12/1999 | Meschter et al. | |
| 6,285,564 B1 | 9/2001 | O' et al. | |
| 6,313,995 B1 | 11/2001 | Koide et al. | |
| 6,616,469 B2 | 9/2003 | Goodwin et al. | |
| 6,713,854 B1 | 3/2004 | Kledzik et al. | |
| 6,957,623 B2 | 10/2005 | Guisinger et al. | |
| 7,190,060 B1 | 3/2007 | Chiang | |
| 7,432,790 B2 | 10/2008 | Arndt et al. | |
| 7,609,523 B1 | 10/2009 | Ni et al. | |
| 8,306,772 B2 | 11/2012 | Cox et al. | |
| 8,415,276 B2 * | 4/2013 | Curatolo | H01L 39/143 505/320 |
| 8,694,939 B1 | 4/2014 | Frost et al. | |
| 8,767,358 B2 * | 7/2014 | Forsyth | H01F 6/06 361/19 |
| 8,780,556 B1 | 7/2014 | Ditri | |
| 9,473,124 B1 * | 10/2016 | Mukhanov | H01L 27/18 |
| 9,627,780 B2 * | 4/2017 | Meinke | H02J 3/00 |
| 9,648,749 B1 | 5/2017 | Christiansen | |
| 9,681,533 B2 | 6/2017 | Christiansen et al. | |
| 10,159,161 B2 | 12/2018 | Christiansen et al. | |
| 10,165,667 B1 | 12/2018 | Christiansen et al. | |
| 10,165,707 B1 | 12/2018 | Christiansen et al. | |
| 10,342,151 B2 | 7/2019 | Christiansen et al. | |
| 10,365,436 B2 | 7/2019 | Byrd et al. | |
| 10,438,867 B2 | 10/2019 | Christiansen et al. | |
| 10,575,437 B1 | 2/2020 | Christiansen et al. | |
| 10,595,441 B1 | 3/2020 | Christiansen et al. | |
| 10,645,845 B2 | 5/2020 | Christiansen et al. | |
| 2002/0187590 A1 | 12/2002 | Bolken et al. | |
| 2003/0213256 A1 * | 11/2003 | Ueda | F25B 49/022 62/230 |
| 2004/0041166 A1 | 3/2004 | Morrison | |
| 2005/0061541 A1 | 3/2005 | Belady | |
| 2006/0221576 A1 | 10/2006 | Takano et al. | |
| 2008/0032456 A1 | 2/2008 | Ahn et al. | |
| 2008/0239683 A1 | 10/2008 | Brodsky et al. | |
| 2011/0075377 A1 | 3/2011 | Paquette et al. | |
| 2012/0140421 A1 | 6/2012 | Kirstine | |
| 2012/0160449 A1 | 6/2012 | Fowler et al. | |
| 2013/0184159 A1 * | 7/2013 | Forsyth | H01F 6/008 505/163 |
| 2013/0333414 A1 | 12/2013 | Inaba et al. | |
| 2014/0268594 A1 | 9/2014 | Wang et al. | |
| 2014/0329688 A1 * | 11/2014 | Aoki | H01F 6/04 505/162 |
| 2016/0073548 A1 | 3/2016 | Wei et al. | |
| 2017/0142820 A1 | 5/2017 | Christiansen et al. | |
| 2017/0373044 A1 * | 12/2017 | Das | H01L 24/16 |
| 2018/0098421 A1 | 4/2018 | Cai et al. | |
| 2020/0072772 A1 | 3/2020 | Graninger | |

FOREIGN PATENT DOCUMENTS

| | | |
|---|---|---|
| JP | 07007188 A | 1/1995 |
| JP | 2007049015 A | 2/2007 |
| JP | 2010186846 A | 8/2010 |
| WO | 2018025016 A1 | 2/2018 |

OTHER PUBLICATIONS

International Search Report and Written Opinion for PCT/US2019/024857 dated Jul. 22, 2019.
Japanese Office Action corresponding to JP Patent No. 2018-525552, pp. 1-3, dated May 29, 2019.
Korean Office Action corresponding to Korean Patent Application No. 10-2018-7013967, pp. 1-6, dated Jun. 24, 2019.
International Search Report and Written Opinion corresponding to PCT/US2019/018766, pp. 1-16, dated May 22, 2019.
International Search Report and Written Opinion corresponding to PCT/US2019/024366, pp. 1-15, dated Jul. 4, 2019.
International Search Report for PCT/US2020/018493 dated May 28, 2020.
International Search Report for International Application No. PCT/US2020/020787 dated Jun. 12, 2020.
Jun Kawai, "Fabrication of superconducting quantum interference device magnetometers on a glass epoxy polyimide resin substrate with copper terminals", Physics Procedia, vol. 36, p. 262-267, 2012.
Gubin, et al.: "Dependence of magnetic penetration depth on the thickness of superconducting Nb thin films"; found on the internet @ http://zb0035.zb.kfa-juelich.de/record/47039/files/74153.pdf; The American Physical Society, Physical Review B 72, 06453 (2005); pp. 1-8.
Locment, et al.: "DC Load and Batteries Control Limitations for Photovoltaic Systems. Experimental Validation"; found on the internet @ http://www.pgembeddedsystems.com/securelogin/upload/project/IEEE/15/PG2012PE1/dc_load_and_batteries_control_limitations_for_photovoltaic_systems_experimental_validation.pdf; IEEE Transactions on Power Electronics, vol. 27, No. 9, Sep. 2012, pp. 4030-4038.
Tolpygo, et al.: "Fabrication Process and Properties of Fully-Planarized Deep-Submicron Nb/Al—AlOx/Nb Josephson Junctions for VLSI Circuits"; found on the internet @ https://arxiv.org/ftp/arxiv/papers/1408/1408.5829.pdf; 2EPo1A-02 DOI: 10.1109/TASC.2014.2374836; pp. 1-13.

* cited by examiner

SUPERCONDUCTOR CRITICAL TEMPERATURE MEASUREMENT

GOVERNMENT INTEREST

The invention was made under Government Contract Number 30080984. Therefore, the US Government has rights to the invention as specified in that contract.

TECHNICAL FIELD

This disclosure relates to superconductors. More particularly, this disclosure relates to measuring a critical temperature of superconductors.

BACKGROUND

Superconductivity is a phenomenon of zero (0) ohms of electrical direct current (DC) resistance and expulsion of magnetic flux fields occurring in certain materials, called superconductors, when cooled below a characteristic critical temperature. Throughout this disclosure, references to electrical resistance (including 0 ohms of electrical resistance) refers to DC resistance. Superconductivity is a quantum mechanical phenomenon that is characterized by the Meissner effect, the complete ejection of magnetic field lines from the interior of the superconductor during the superconductor's transition into the superconducting state. The occurrence of the Meissner effect indicates that superconductivity cannot be understood simply as the idealization of perfect conductivity in classical physics.

The electrical resistance of a metallic conductor decreases gradually as temperature is lowered. In ordinary (non-superconducting) conductors, such as copper or silver, this decrease is limited by impurities and other defects. Even near absolute zero (0) (near 0 Kelvin), a real sample of a normal conductor shows some resistance. In a superconductor, the resistance drops abruptly to zero (0) ohms when the material is cooled below the critical temperature of the material. An electric current through a loop of superconducting wire can persist indefinitely with no power source.

SUMMARY

One example relates to a system for measuring critical temperatures of superconducting components. The system can include a superconducting circuit housed in a cryogenic chamber with a controllable ambient temperature. The superconducting circuit can have a plurality of superconductor-resistor pairs connected in series. Each of the plurality of superconductor-resistor pairs can include a superconducting component and a resistor coupled in parallel with the superconducting component. The system can also include a resistance meter that measures a resistance of the superconducting circuit. The system further includes a controller that commands the cryogenic chamber to gradually sweep the ambient temperature. The controller can also record an instant ambient temperature as a critical temperature for a given superconducting component of a corresponding one of the plurality of superconductor-resistor pairs in response to detecting a change in a measured resistance across an input node and an output node of the superconducting circuit.

Another example relates to a system for measuring critical temperatures of superconducting components. The system can include an integrated circuit (IC) chip having a layer stack forming a superconducting circuit. The superconducting circuit can have a plurality of superconductor-resistor pairs connected in series. Each of the plurality of superconductor-resistor pairs includes a superconducting component and a resistor coupled in parallel with the superconducting component. The system also includes a resistance meter that measures the resistance of the superconducting circuit. The system can further include a controller that commands the cryogenic chamber to gradually sweep the ambient temperature. The controller can also record an instant ambient temperature as a critical temperature for a given superconducting component of a corresponding one of the plurality of superconductor-resistor pairs in response to detecting a change in a measured resistance across the superconducting circuit.

Yet another example relates to a method for measuring critical temperatures of superconducting components. The method can include measuring a resistance of a superconducting circuit housed in a cryogenic chamber with a controllable ambient temperature. The superconducting circuit includes a plurality of superconductor-resistor pairs connected in series. Each of the plurality of superconductor-resistor pairs can include a superconducting component and a resistor coupled in parallel with the superconducting component. The method can further include causing the cryogenic chamber to gradually sweep the ambient temperature. The method can yet further include recording an instant ambient temperature as a critical temperature for a given superconducting component of a corresponding one of the plurality of superconductor-resistor pairs in response to detecting a change in a measured resistance across the superconducting circuit.

DETAILED DESCRIPTION

Figure 1:
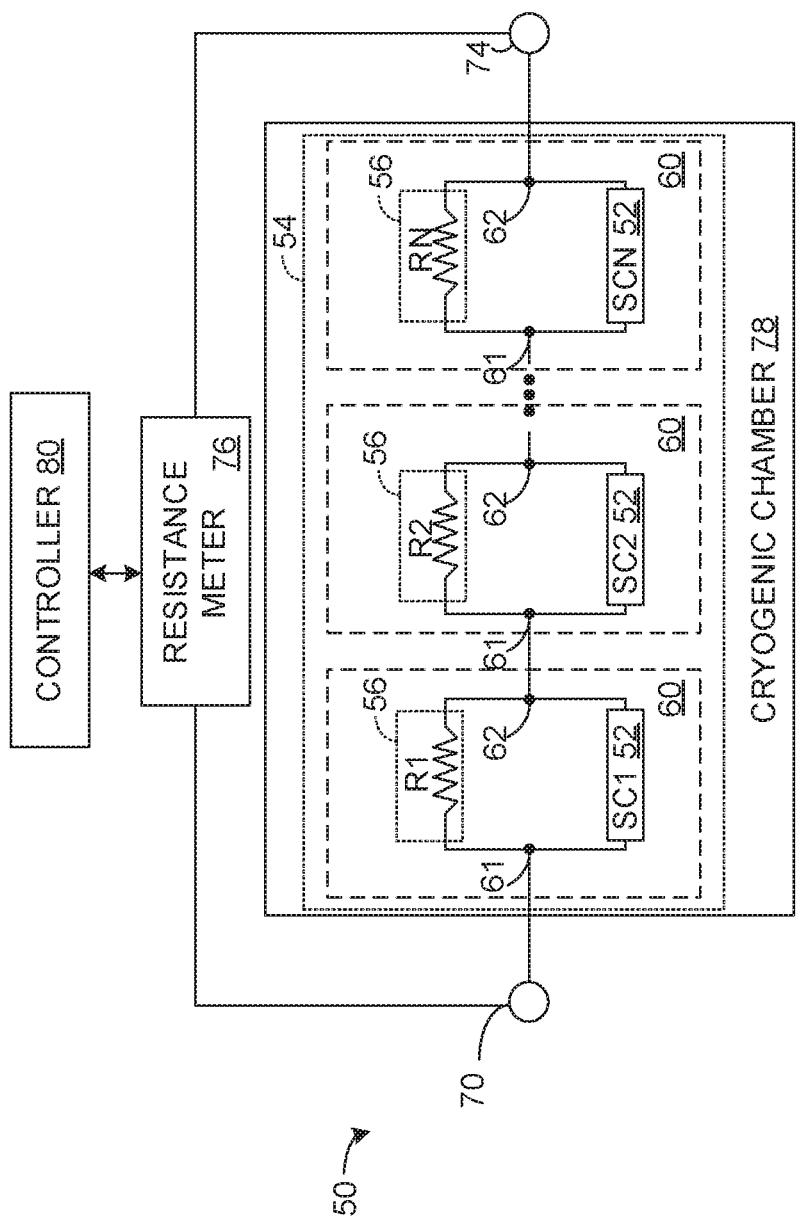
FIG. 1 illustrates an example of a system for determining a critical temperature for a plurality of superconducting components.

Systems and methods for measuring critical temperatures of superconducting components are disclosed. In particular, the superconducting components can be constituent components of a superconducting circuit. The superconducting circuit can have a plurality of superconductor-resistor pairs connected in series. Each of the plurality of superconductor-resistor pairs includes a superconducting component and a resistor coupled in parallel with the superconducting component. In some examples, the superconducting circuit can be formed in an integrated circuit (IC) chip. Moreover, the superconducting circuit can be housed in a temperature-controlled cryogenic chamber.

A resistance meter can be coupled to the superconducting circuit, and the resistance meter can measure the resistance of the superconducting circuit. The resistance meter can provide a signal (e.g., an analog signal or a digital signal) to a controller that characterizes a real-time measured resistance of the superconducting circuit.

The superconductor-resistors pairs are configured such that when a particular superconducting component of a particular superconductor-resistor pair operates above the critical temperature, nearly all of the current flowing through the particular superconductor-resistor pair flows through the corresponding resistor of the particular superconductor-resistor pair. Conversely, upon the ambient temperature of the superconducting circuit being at or below the critical temperature of the particular superconducting component, the particular superconducting component operates in a superconducting state, such that the resistance of the particular superconductor-resistor pair is approximately equal to zero (0) ohms. Additionally, the superconducting circuit can be configured such that the resistors in each of the superconductor-resistor pairs each have a unique resistance. That is, two resistors of different superconductor-resistor pairs have different resistances.

In one example, initially, the controller can be programmed to command the cryogenic chamber to set the ambient temperature to a level that is above the critical temperature for each of the superconducting components in the superconducting circuit. In this situation, the resistance meter provides a resistance that is nearly equal to the sum of the resistances of each resistor of each superconductor-resistor pair. In another example, initially, the controller can be programmed to command the cryogenic chamber to set the ambient temperature to a level that is below the critical temperature for each of the superconducting components in the superconducting circuit. In this situation, the resistance meter measures a resistance that is zero (0) ohms or nearly zero (0) ohms. Moreover, in either situation, the controller can be programmed to command the cryogenic chamber to gradually sweep the ambient temperature. As used herein, the term "gradually sweep" (and its derivatives) indicates the ambient temperature is gradually increased or decreased.

In situations where the ambient temperature decreases, each of the superconducting components transitions from a non-superconducting state to the superconducting state. The controller can detect a drop in resistance each time one of the superconducting components transitions to the superconducting state. Thus, for a given superconducting component of a given superconductor-resistor pair, upon the given superconducting component transitioning to the superconducting state, the resistance of the superconducting circuit drops by about the resistance of a given resistor in the given superconductor-resistor pair. In situations where the ambient temperature increases, the controller can detect a rise in resistance each time one of the superconducting components transitions from the superconducting state to the non-superconducting state. Thus, for the given superconducting component of the given superconductor-resistor pair, upon the given superconducting component transitioning to the non-superconducting state, the resistance of the superconducting circuit rises by about the resistance of a given resistor in the given superconductor-resistor pair. Accordingly, by measuring the resistance change (the drop or rise), the controller can record the critical temperature for the given superconducting component. In this manner, as the ambient temperature continues to change during the sweep, the controller can determine and record the critical temperature for each superconducting component in the superconducting circuit with a single temperature sweep.

FIG. 1 illustrates an example of a system 50 for determining the critical temperature for a plurality of superconducting components 52 in a superconducting circuit 54. As used herein, the term "superconducting circuit" refers to an electrical circuit that includes (at least one) superconducting component. In the example illustrated, there are N number of superconducting components 52 labeled SC1 . . . SCN, where N is an integer greater than or equal to two (2). Each superconducting component 52 can be connected in parallel with (shunted by) a corresponding resistor 56, such that the system 50 includes N number of resistors 56, labeled R1 . . . RN. That is, there are N number of pairs of superconducting components 52 and resistors 56, wherein each pair can be referred to as a superconductor-resistor pair 60.

Each superconducting component 52 could be implemented, for example, as a trace of superconducting material on an integrated circuit (IC) chip. In some examples, the N number of superconducting components 52 can be made from the same material. In other examples, the N number of superconducting components 52 can be implemented with different materials.

For each superconductor-resistor pair 60, the corresponding superconducting component 52 and the corresponding resistor 56 can be coupled to an input node 61 and an output node 62. Moreover, each of the N number of superconductor-resistor pairs 60 can be connected in series (cascaded fashion). Thus, for each of the second (2) to the penultimate (N−1) superconductor-resistor pairs 60 an output node 62 of a given superconductor-resistor pair 60 is an input node 61 of a next superconductor-resistor pair 60. Further, the input node 61 of the first (1) superconductor-resistor pair 60 can be an input node 70 of the superconducting circuit 54. Additionally, the input node 70 of the superconducting circuit 54 can be connected to a given terminal of a resistance meter 76. Moreover, the output node 62 of the Nth (final) superconductor-resistor pair 60 can be an output node 74 of the superconducting circuit 54, and the output node 74 of the superconducting circuit 54 can be coupled another terminal the resistance meter 76.

As one example, the resistance meter 76 can apply a controlled current between the input node 70 and the output node 74 of the superconducting circuit 54, which flows through the superconducting circuit 54. The resistance meter 76 can measure a real-time voltage between the input node 70 and the output node 74 of the superconducting circuit 54 to determine a resistance of the superconducting circuit 54.

The resistance of each resistor 56 is much less (e.g., between about one-half less and about three orders of magnitude less) than the resistance of the corresponding superconducting component 52, when the corresponding superconducting component 52 is operating above the critical temperature (not superconducting). Additionally, each of the N number of resistors 56 have a different known and predetermined resistance that can range from about 10 ohms to about 1 kilo-ohm. The particular resistance selected for each resistor 56 can be based, for example, on the resistance of the corresponding superconducting component 52 operating above the critical temperature (not superconducting). Additionally, each resistor 56 has a known resistance that is unique among the N number of resistors 56.

The N number of superconductor-resistor pairs 60 can be housed in a cryogenic chamber 78. The cryogenic chamber 78 can be implemented as a system that can set a controllable ambient temperature of a region to a level of about 10 Kelvin or below. Additionally, in some examples the resistance meter 76 can be external to the cryogenic chamber 78.

A controller 80 can be coupled to the resistance meter 76 and the cryogenic chamber 78. The controller 80 can be representative of a microcontroller with machine-executable instructions embedded therein. Alternatively, the controller 80 can be implemented as a general purpose computer that can execute machine readable instructions stored on a nontransitory machine readable medium (e.g., volatile or non-volatile random access memory).

The controller 80 can command the cryogenic chamber 78 to set the ambient temperature, such that the temperature of the cryogenic chamber 78 varies as a function of time. Additionally, the controller 80 can receive a signal (an analog or digital signal) characterizing a measured resistance across the superconducting circuit 54 (across the N number of superconductor-resistor pairs 60) that varies as a function of time and temperature of the cryogenic chamber 78 that houses the superconducting circuit 54, as described herein.

The controller 80 can operate in one of several modes of operation. In one example, during an initial mode of operation, the controller 80 commands the cryogenic chamber 78 to set the ambient temperature for the N number of superconductor-resistor pairs 60 to a known temperature at which each of the N number of superconducting components 52 are not in the superconducting state. In another example, during the initial mode of operation, the controller 80 commands the cryogenic chamber 78 to set the ambient temperature for the N number of superconductor-resistor pairs 60 to a known temperature at which each of the N number of superconducting components 52 are in the superconducting state.

In the initial mode of operation, the resistance meter 76 can provide a signal to the controller 80 characterizing a measured resistance across the N number of superconductor-resistor pairs 60. In the initial mode of operation where the ambient temperature is set above the critical temperature of each of the N number of superconductors 52, the resistance, R of the N number of superconductor-resistor pairs 60 can be characterized by Equation 1:

$$R \approx \Sigma_{i=1}^{N} R_i \qquad \text{Equation 1:}$$

wherein:

$R_i$ is the resistance of a corresponding one of the N number of resistors, R1 . . . RN As noted, when the N number of superconducting components 52 (SC1 . . . SCN) operate above the critical temperature, the resistance of the resistors 56 (R1 . . . RN) is much less (e.g., between about one-half less and three orders of magnitude less) than the resistance of the superconducting components 52. Thus, as demonstrated in Equation 1, in the initial mode where the ambient temperature is set above the critical temperature of each of the N number of superconductors 52, nearly all of the current from the resistance meter 76 passes through the N number of resistors 56. Conversely, in the initial mode where the ambient temperature is set below the critical temperature of each of the N number of superconductors 52, the resistance, R of the N number of superconductor-resistor pairs 60 is zero (0) ohms or near zero (0) ohms.

Additionally, the controller 80 can switch to a critical temperature discovery mode of operation. In the critical temperature discovery mode, the controller 80 attempts to determine the critical temperature for each of the N number of superconducting components 52 through a gradual sweep of the ambient temperature of the cryogenic chamber 78. For instance, in one example of the critical temperature discovery mode of operation, the controller 80 can command the cryogenic chamber 78 to gradually lower the ambient temperature of the N number of superconductor-resistor pairs 60. As the critical temperature is crossed for a given superconducting component 52 in a given superconductor-resistor pair 60, the given superconducting component 52 transitions to the superconducting state, and the resistance of the superconducting circuit 54 drops by the amount of resistance of a given resistor 56 in the given superconductor-resistor pair 60. That is, as the ambient temperature for the given superconductor-resistor pair 60 falls below the critical temperature for the given superconducting component 52, the resistance of the given superconducting component 52 drops to zero (0) ohms such that the resistance of the given superconductor-resistor pair 60 also drops to zero (0) ohms. Thus, nearly all current flowing through the given superconductor-resistor pair 60 flows through the superconducting component 52 and the overall resistance of the N number of superconductor-resistor pairs 60 drops by the resistance of the given resistor 56.

Additionally, in another example of the critical temperature discovery mode of operation, the controller 80 can command the cryogenic chamber 78 to gradually increase the ambient temperature of the N number of superconductor-resistor pairs 60. In such a situation (a gradual increase of the ambient temperature), as the critical temperature is crossed for a given superconducting component 52 in a given superconductor-resistor pair 60, the given superconducting component 52 transitions to the non-superconducting state, and the resistance of the superconducting circuit 54 rises by the amount of resistance of a given resistor 56 in the given superconductor-resistor pair 60. That is, as the ambient temperature for the given superconductor-resistor pair 60 rises above the critical temperature for the given superconducting component 52, the resistance of the given superconducting component 52 rises such that the resistance of the given superconductor-resistor pair 60 also rises by the resistance of the given resistor 56. Thus, nearly all current flowing through the given superconductor-resistor pair 60 flows through the given resistor 56 and the overall resistance of the N number of superconductor-resistor pairs 60 rises by about the resistance of the given resistor 56.

In either such situation, based on the detected resistance change (e.g., drop or rising by a known resistance), the controller 80 can access a data structure (e.g., a database or a table) to identify a superconducting component 52 that corresponds to the resistance change. In this manner, the controller 80 can identify the resistance change and record the instant (present) ambient temperature as the critical temperature for the given superconducting component 52 of the given superconductor-resistor pair 60. Additionally, continuing in the critical temperature discovery mode, the controller 80 can command the cryogenic chamber 78 to continue to sweep the ambient temperature until the critical temperature for each of the N number of superconducting components 52 has been reached and recorded.

Figure 2:
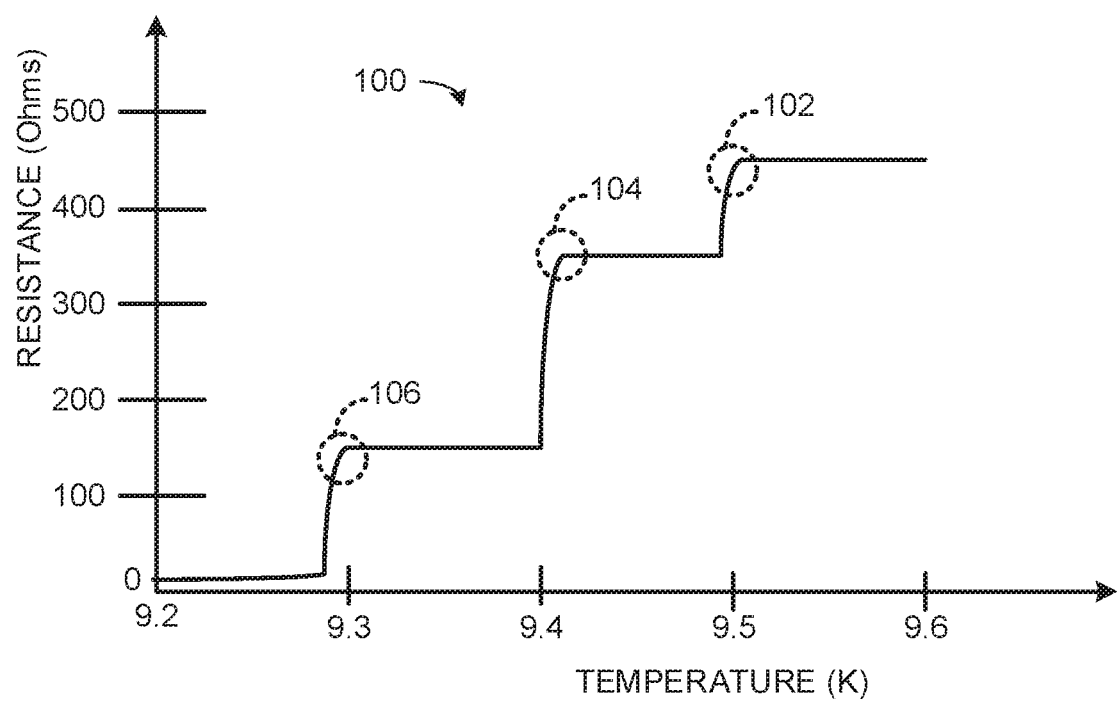
FIG. 2 illustrates a graph that plots resistance as a function of temperature for a superconducting circuit.

FIG. 2 illustrates a graph 100 that plots resistance as a function of temperature for an example of the superconducting circuit 54 with three (3) superconductor-resistor pairs 60. Continuing with this example, it is presumed that resistor R1 has a resistance of 100 ohms, resistor R2 has a resistance of 150 ohms and resistor R3 has a resistance of 200 ohms. As illustrated by a point 102 of the graph 100 at a temperature of 9.50 K, the resistance drops abruptly by 100 ohms. Thus, the first superconductor, SC1 has a critical temperature of 9.50 K. Additionally, as illustrated by a point 104 at a temperature of 9.42 K, the resistance drops abruptly by 200 ohms. Thus, the third superconductor SC3 has a critical temperature of 9.42 K. Further, as illustrated by a point 106, at a temperature of 9.30 K, the resistance drops abruptly by nearly 150 ohms. Thus, the second superconductor SC2 has a critical temperature of 9.30 K.

Referring back to FIG. 1, the controller 80 can record the critical temperature for each of the N number of superconducting components 52. Additionally, by arranging the N number of superconductor-resistors pairs 60 in a series (as a cascade), a single sweep of temperature can be employed to identify the critical temperature for each of the N number of superconducting components 52. That is, the system 50 avoids the need to separately measure the critical temperature of each superconducting component 52. Accordingly, by employment of the system 50, the critical temperature for each superconducting component 52 can be easily determined. Thus, in examples where each of the superconducting components 52 are formed of the same material but with different processing techniques, the effects that the different processing techniques have on the critical temperature can be quantified. By quantifying the impact that processing techniques have on the critical temperature, the critical temperature of superconducting circuits (including IC chips) that employ the same techniques can be predicted. Alternatively, in situations where some (or all) of the superconducting components 52 are formed with different materials, the critical temperature for each such different material can be determined.

Figure 3:
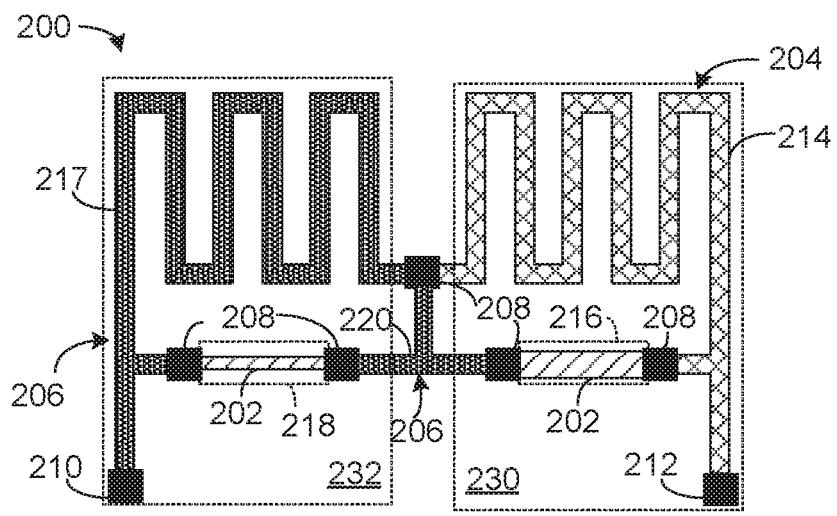
FIG. 3 illustrates a top view of a layer stack of a superconducting circuit of an integrated circuit (IC) chip.
Figure 4:
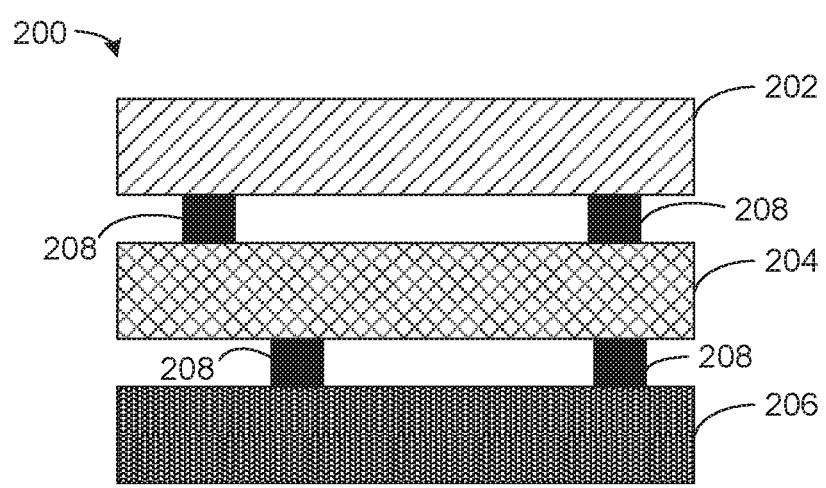
FIG. 4 illustrates a side view of the layer stack of FIG. 3.

FIG. 3 illustrates a top-down view of a layer stack 200 that could be employed in a die for a superconducting circuit implemented in an integrated circuit (IC) chip. That is, the layer stack 200 can be representative of a IC chip or some component thereof. FIG. 4 is a side view of the layer stack 200 of FIG. 3. For purposes of simplification of explanation, the same reference numbers are employed in FIGS. 3 and 4 to denote the same structure. The layer stack 200 illustrated in FIGS. 3 and 4 could be employed to implement the superconducting circuit 54 illustrated in FIG. 1.

The layer stack 200 includes three (3) layers, but in other examples, more layers could be employed. In the example illustrated, a resistive layer 202 overlays a first superconducting layer 204, which in turn overlays a second superconducting layer 206. The first superconducting layer 204 and the second superconducting layer 206 could be formed from the same or different superconducting material. The layers of the layer stack 200 can be connected through vias 208. The vias 208 allow electrical current to pass between the layers of the layer stack 200. The layer stack 200 can be formed with superconducting IC fabrication techniques. The first superconducting layer 204 and the second superconducting layer 206 can be employed, for example, to implement the N number of superconducting components 52 of FIG. 1. Additionally, the resistive layer 202 can be employed to implement the N number of resistors 56 of FIG. 1.

A trace 214 of the first superconducting layer 204 could be employed to implement the first superconducting component 52 of FIG. 1. Accordingly, a first resistor 216 (formed in the resistive layer 202) can shunt the trace 214 of the first superconducting layer 204. Additionally, a first trace 217 of the second superconducting layer 206 could be employed to implement the second superconducting component 52 of FIG. 1. Accordingly, a second resistor 218 shunts the first trace 217 of the second superconducting layer 206. Additionally, a second trace 220 of the second superconducting layer 206 is coupled to the first resistor 216, the second resistor 218, the trace 214 of the first superconducting layer 204 and the first trace 217 of the second superconducting layer 206. Accordingly, in this arrangement, the trace 214 of the first superconducting layer 204 and the first resistor 216 form a first superconductor-resistor pair 230. Similarly, in this arrangement, the first trace 217 of the second superconducting layer 206 and the second resistor 218 form a second superconductor-resistor pair 232. However, in other examples, other arrangements are possible.

In the example illustrated, the first resistor 216 has a smaller resistance than the second resistor 218. Accordingly, a trace of the resistive layer 202 representing the second resistor 218 is narrower than a trace of the resistive layer 202 representing the first resistor 216. Additionally, the first resistor 216 and the second resistor 218 have known and predetermined resistances. The first resistor 216 and the second resistor 218 can have a resistance that ranges from about 10 ohms to about 1 kilo-ohms.

In some examples, the input node 210 and the output node 212 can be coupled to connection pads of a substrate (e.g., a package for an IC chip). Moreover, the layer stack 200 can be housed in a cryogenic chamber, such as the cryogenic chamber 78 of FIG. 1.

In one of example of an initial mode of operation, an ambient temperature for the layer stack 200 is set by the cryogenic chamber (in response to a command from a controller, such as the controller 80 of FIG. 1) to a level above the critical temperature for each of the first superconducting layer 204 and the second superconducting layer 206. In another of example of the initial mode of operation, an ambient temperature for the layer stack 200 is set by the cryogenic chamber to a level at or below the critical temperature for each of the first superconducting layer 204 and the second superconducting layer 206. Additionally, a resistance can be measured across the input node 210 and the output node 212.

When the first superconducting layer 204 and the second superconducting layer 206 operate above the critical temperature, the resistance of the first resistor 216 and the second resistor 218 is much less (e.g., between about one-half less and three orders of magnitude less) than the resistance of the first superconducting layer 204 and the second superconducting layer 206. Thus, in the example of the initial mode where the ambient temperature is above the critical temperature of the first superconducting layer 204 and the second superconducting layer 206, nearly all of the current passing between the input node 210 to the output node 212 passes through the first resistor 216 and the second resistor 218. Conversely, in the example of the initial mode where the ambient temperature is below the critical temperature of the first superconducting layer 204 and the second superconducting layer 206, nearly all of the current passing between the input node 210 to the output node 212 passes through the first superconducting layer 204 and the second superconducting layer 206.

Additionally, the controller can switch to a critical temperature discovery mode. In the critical temperature discovery mode, the controller can command the cryogenic chamber housing the layer stack 200 to gradually sweep (decrease or increase) the ambient temperature to attempt to determine the critical temperature for first superconducting layer 204 and the second superconducting layer 206. As the ambient temperature is crossed for either the first superconducting layer 204 or the second superconducting layer 206, the resistance changes (drops or rises) by the amount of resistance of a corresponding resistor (the first resistor 216 or the second resistor 218) in the corresponding superconductor-resistor pair 230 or 232. For example, in a situation where the sweep decreases the ambient temperature, if the ambient temperature for the layer stack 200 falls below the critical temperature for the second superconducting layer 206, the resistance of the second superconducting layer 206 drops to zero (0) ohms such that the resistance of the second superconductor-resistor pair 232 also drops to zero (0) ohms. Thus, nearly all current flowing through the second superconductor-resistor pair 232 flows through the second superconducting layer 206 and the overall resistance between the input node 210 and the output node 212 drops by the resistance of the second resistor 218.

Alternatively, in a situation where the sweep increases the ambient temperature, if the ambient temperature for the layer stack 200 rises above the critical temperature for the second superconducting layer 206, the resistance of the second superconducting layer 206 rises by the resistance of the second resistor 218. Thus, nearly all current flowing through the second superconductor-resistor pair 232 flows through the resistive layer 202 and the overall resistance between the input node 210 and the output node 212 rises by the resistance of the second resistor 218. In either example of the sweep (decreasing or increasing the ambient temperature), the controller can identify and record the critical temperature for the second superconducting layer 206 of the second superconductor-resistor pair 232. Additionally, continuing in the critical temperature discovery mode, the controller causes the cryogenic chamber to continue to gradually sweep (decrease or increase) the ambient temperature until the critical temperature for the first superconducting layer 204 is reached and recorded in a similar manner.

Accordingly, by arranging the first superconductor-resistor pair 230 and the second superconductor-resistor pair 232 in a cascade, a single sweep of temperature can be employed to identify the critical temperature for the first superconducting layer 204 and the second superconducting layer 206. Accordingly, by employment of the layer stack 200, the critical temperature for each superconducting layer of the layer stack 200 can be easily determined. Moreover, in examples where each of the superconducting layers of the layer stack 200 are formed of the same material but with different processing techniques, the effects that the different processing techniques have on the critical temperature can be quantified.

Figure 5:
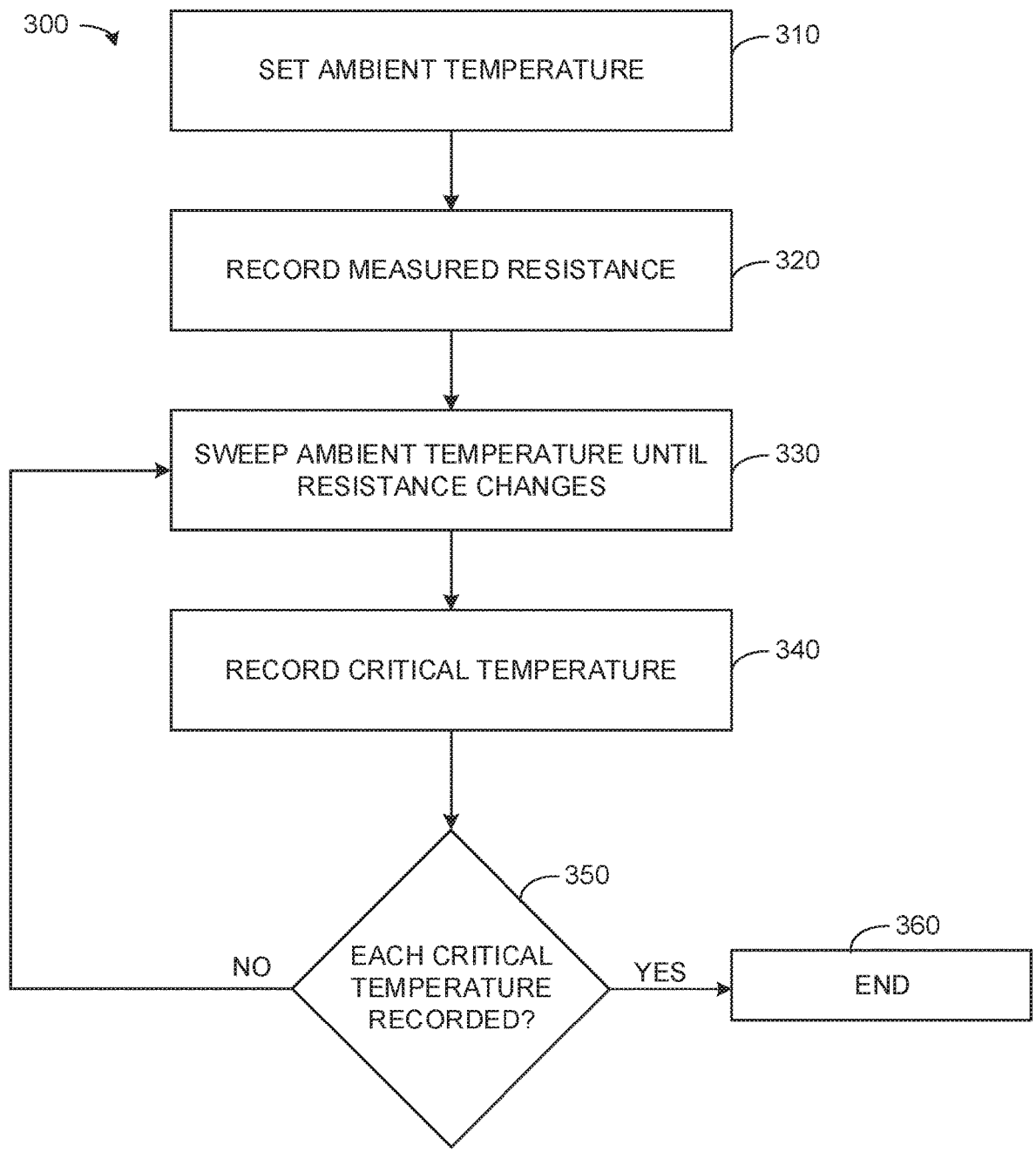
FIG. 5 illustrates a flowchart of an example method for determining a critical temperature for a plurality of superconducting components.

In view of the foregoing structural and functional features described above, an example method will be better appreciated with reference to FIG. 5. While, for purposes of simplicity of explanation, the example method of FIG. 5 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method.

FIG. 5 illustrates a flowchart of an example method 300 for determining the critical temperature of N number of superconducting components (e.g., the superconducting components 52 of FIG. 1) in a superconducting circuit (e.g., the superconducting circuit 54 of FIG. 1) operating in a cryogenic chamber (e.g., the cryogenic chamber 78 of FIG. 1). The method 300 can be implemented, for example, by a controller (e.g., the controller 80 of FIG. 1).

At 310, the controller causes the cryogenic chamber to set the ambient temperature to a level that is above or below the critical temperature for each of the N number of superconducting components. At 320, the controller records a measured resistance for the superconducting circuit. At 330, the controller causes the cryogenic chamber to gradually sweep the ambient temperature for the superconducting circuit until a resistance change is measured. At 340, the controller records the instant (present) ambient temperature as the critical temperature for the superconducting component that corresponds to the resistance change at 330.

At 350, a determination is made as to whether the critical temperature for each superconducting component has been recorded. If the determination at 350 is positive (e.g., YES), the method 300 proceeds to 360. If the determination at 350 is negative (e.g., NO), the method 300 returns to 330. At 360, the method 300 ends.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A system for measuring critical temperatures of superconducting components comprising:
    a superconducting circuit housed in a cryogenic chamber with a controllable ambient temperature, the superconducting circuit having a plurality of superconductor-resistor pairs connected in series, wherein each of the plurality of superconductor-resistor pairs comprises:
        a superconducting component; and
        a resistor coupled in parallel with the superconducting component;
    a resistance meter that measures a resistance of the superconducting circuit; and
    a controller that:
        commands the cryogenic chamber to gradually sweep the ambient temperature; and
        records an instant ambient temperature as a critical temperature for a given superconducting component of a corresponding one of the plurality of superconductor-resistor pairs in response to detecting a change in a measured resistance across an input node and an output node of the superconducting circuit.

2. The system of claim 1, further wherein the gradual sweep is a gradual decrease in the ambient temperature.

3. The system of claim 1, further wherein the gradual sweep is a gradual increase in the ambient temperature.

4. The system of claim 1, wherein each resistor of each of the plurality of superconductor-resistor pairs has a unique resistance.

5. The system of claim 4, wherein the resistor of each superconductor-resistor pairs has a resistance within a range of about 10 ohms to about 1 kilo-ohm.

6. The system of claim 4, wherein each superconducting component of each of the plurality of superconductor-resistor pairs is formed from the same material.

7. The system of claim 4, wherein at least two superconducting components of the plurality of superconductor-resistor pairs are formed from a different superconducting material.

8. The system of claim 4, wherein the plurality of superconductor-resistor pairs comprises at least three superconductor-resistor pairs.

9. The system of claim 4, wherein the superconducting circuit is integrated within a die of an integrated circuit (IC) chip.

10. The system of claim 9, wherein the input node and the output node of the superconducting circuit are coupled to respective conductive pads of the IC chip.

11. A system for measuring critical temperatures of superconducting components comprising:
an integrated circuit (IC) chip having a layer stack forming a superconducting circuit, the superconducting circuit having a plurality of superconductor-resistor pairs connected in series, wherein each of the plurality of superconductor-resistor pairs comprises:
a superconducting component; and
a resistor coupled in parallel with the superconducting component;
a resistance meter that measures the resistance of the superconducting circuit; and
a controller that:
commands the cryogenic chamber to gradually sweep the ambient temperature; and
records an instant ambient temperature as a critical temperature for a given superconducting component of a corresponding one of the plurality of superconductor-resistor pairs in response to detecting a change in a measured resistance across the superconducting circuit.

12. The system of claim 11, wherein the layer stack comprises:
a resistive layer that forms each resistor in each of the superconductor-resistor pairs;
a first superconducting layer that forms a first superconducting component in the superconductor-resistor pairs; and
a second superconducting layer that forms a second superconducting component in the superconductor-resistor pairs.

13. The system of claim 12, wherein the first superconducting layer and the second superconducting layer are formed of a same material.

14. The system of claim 12, wherein the first superconducting layer and the second superconducting layer are formed of different materials.

15. The system of claim 12, wherein the first superconducting layer and the second superconducting layer have different critical temperatures.

16. The system of claim 12, wherein an input node and an output node of the superconducting circuit are coupled to respective conductive pads of the IC chip.

17. A method for measuring critical temperatures of superconducting components comprising:
measuring a resistance of a superconducting circuit housed in a cryogenic chamber with a controllable ambient temperature, the superconducting circuit having a plurality of superconductor-resistor pairs connected in series, wherein each of the plurality of superconductor-resistor pairs comprises:
a superconducting component; and
a resistor coupled in parallel with the superconducting component;
causing the cryogenic chamber to gradually sweep the ambient temperature; and
recording an instant ambient temperature as a critical temperature for a given superconducting component of a corresponding one of the plurality of superconductor-resistor pairs in response to detecting a change in a measured resistance across the superconducting circuit.

18. The method of claim 17, wherein each superconducting component of each of the plurality of superconductor-resistor pairs is formed from the same material.

19. The method of claim 17, wherein the superconducting circuit is integrated within a die of an integrated circuit (IC) chip.

20. The method of claim 17, wherein each superconducting component of each of the plurality of superconductor-resistor pairs has a different critical temperature.

* * * * *